United States Patent [19]

Tachikawa et al.

[11] 4,435,228

[45] Mar. 6, 1984

[54] PROCESS FOR PRODUCING $Nb_3Sn$ SUPERCONDUCTING WIRES

[75] Inventors: Kyoji Tachikawa, Tokyo; Yuji Yoshida, Sakura, both of Japan

[73] Assignee: National Research Institute for Metals, Tokyo, Japan

[21] Appl. No.: 466,518

[22] Filed: Feb. 15, 1983

[30] Foreign Application Priority Data

Feb. 22, 1982 [JP] Japan ................................. 57-25981

[51] Int. Cl.³ ............................................ H01L 39/24
[52] U.S. Cl. ............................. 148/11.5 Q; 148/133; 428/930
[58] Field of Search ............... 148/11.5 F, 11.5 Q, 148/11.5 P, 11.5 R, 133, 127; 420/492; 29/599; 428/930

[56] References Cited

U.S. PATENT DOCUMENTS 2,943,960  7/1960  Saarivirta .......................... 148/411
3,019,102  1/1962  Saarivirta .......................... 420/492
4,324,842  4/1982  Luhman et al. ................... 428/930

FOREIGN PATENT DOCUMENTS 1582303  9/1969  France .............................. 428/930

OTHER PUBLICATIONS

Flükiger et al., "Fabrication on a Laboratory Scale and Mechanical Properties of Cu-Nb-Sn Multifilamentary Superconducting Composite Wires Produced by Cold Powder Metallurgy Processing", Appl. Phys. Lett., 35(10), Nov. 15, 1979, pp. 810-812.

*Primary Examiner*—Peter K. Skiff
*Attorney, Agent, or Firm*—Fitzpatrick, Cella, Harper & Scinto

[57] ABSTRACT

A process for producing a $Nb_3Sn$ superconducting wire, which comprises preparing a composite from a copper alloy material containing 0.1 to 5 atomic percent in total of at least one element of Group IV of the periodic table selected from titanium, zirconium and hafnium, a tin material and a niobium material, processing the composite into a wire, tape or tube, and heat-treating the processed composite at a temperature of 400° to 900° C. to form a $Nb_3Sn$ compound.

8 Claims, 2 Drawing Figures

"4,435,228"

PROCESS FOR PRODUCING NB₃SN SUPERCONDUCTING WIRES

FIELD OF THE INVENTION

This invention relates to a process for producing a Nb₃Sn superconducting wire having improved strong magnetic field characteristics by the addition of at least one metal selected from titanium, zirconium and hafnium which are elements of Group IV of the periodic table.

DESCRIPTION OF THE PRIOR ART

The use of a superconducting wire enables a large electric current to flow without power consumption even in a strong magnetic field. Hence, it has been exploited for utilization as a coil wire for electromagnets capable of generating a strong magnetic field. Superconducting wires made of Nb-Ti based alloys now gain most widespread acceptance. The magnetic field generated by this type of alloy superconducting wire is about 9 tesla (90,000 gauss) at the highest, and when a stronger magnetic field is required, it is necessary to use a compound-type superconductor having a high critical magnetic field. The compound-type superconductor, however, lacks plasticity, and this constitutes a great drawback in putting it to practical applications. In recent years, methods utilizing diffusion, such as a surface diffusion method and a composite processing method, have been invented, and made it possible to produce practical superconducting tapes and wires of the compound type such as Nb₃Sn (critical temperature: about 18 K; critical magnetic field: about 21 tesla) and V₃Ga (critical temperature: about 15 K; critical magnetic field: about 22 tesla).

The surface diffusion method, for example in the case of producing a Nb₃Sn superconducting tape, denotes a method which comprises continuously passing a niobium tape as a substrate through a bath of molten tin, and heattreating the tape to diffuse and react niobium and tin and thereby to form a layer of Nb₃Sn compound on the surface of the tape. The composite processing method, for example in the case of producing a Nb₃Sn compound, denotes a method which comprises preparing a composite composed of niobium cores and a copper-tin alloy matrix, thereafter processing the composite into a wire, a tape or a tube, and heat-treating the processed composite to selectively diffuse and react tin in the copper-tin alloy matrix and the niobium cores and thereby to form a layer of Nb₃Sn compound around the niobium cores. The use of the composite processing method enables the production of an ultrafine multicore wire in which a number of fine niobium cores are embedded in a copper-tin alloy matrix, and there can be obtained a high degree of stability with which superconductivity is maintained even upon rapid variations in magnetic field. An ultrafine multicore wire of V₃Ga can be produced by a similar method. Nb₃Sn or V₃Ga superconducting tapes and wires produced by the aforesaid surface diffusion method and composite processing method have already been in use for small-sized strong magnetic field magnets in studying the properties of a material.

On the other hand, works have actively been done for the development of large-sized strong magnetic field magnets for use in nuclear fusion reactors, high energy accelerating devices, superconducting generators, etc., and there is an urgent need to develop practical compound-type ultrafine multicore wires which have a high critical current in a strong magnetic field region of at least 15 tesla and stable superconductivity in rapidly varying magnetic fields so as to be acceptable in the aforesaid uses. However, the critical current of a Nb₃Sn compound wire produced from a conventional composite of niobium cores and a copper-tin alloy matrix rapidly decreases in a magnetic field of more than about 12 tesla, and it is difficult to produce from this wire a superconducting magnet capable of generating a strong magnetic field of more than 12 tesla. On the other hand, a V₃Ga compound wire has better strong magnetic field characteristics, but since the cost of materials for it is high, it is by no means advantageous for use in large facilities in which a large amount of the wire is used. If, therefore, a Nb₃Sn superconducting wire having improved strong magnetic field characteristics can be obtained, it would be advantageously used in the aforesaid applications. Methods were recently invented for producing a Nb₃Sn compound wire having markedly improved critical current characteristics in a strong magnetic field which comprise adding titanium, zirconium or hafnium, each of which is an element of Group IV of the periodic table, to niobium cores or a copper-tin alloy matrix (U.S. Ser. No. 302,956, now U.S. Pat. No. 4,385,942 and U.S. Ser. No. 402,581).

According to these methods, the Group IV element added to the niobium cores or to the copper-tin alloy matrix accelerates the formation of the Nb₃Sn compound, and a part of the Group IV element dissolves in the Nb₃Sn compound layer to increase the critical magnetic field of the Nb₃Sn compound layer and its critical currrent in a strong magnetic field. Since, however, the Group IV element is added to the niobium cores or the copper-tin alloy matrix in these methods, the plastic workability of the niobium cores or the copper-tin alloy matrix is reduced, and it should be subjected to intermediate annealing every time it is elongated to a cross-sectional area reduction of about 40%, more frequently than the conventional composite processing method. If the intermediate annealing is not carried out, cracks will form in the copper-tin alloy matrix and the wire will finally break. For this reason, annealing must be carried out a great number of times in the prior art in producing a wire of practical length, and this undesirably leads to a marked increase in the cost of production. Furthermore, in the copper-tin alloy matrix used in the conventional composite processing method, the amount of tin dissolved in copper is limited in order to maintain plastic workability. This leads to a poor tin supply from the copper-tin alloy for forming the Nb₃Sn layer. As a result, the proportion of the formed Nb₃Sn compound layer in the total cross-sectional area of the wire is small, and it is impossible to produce a wire having a large critical current capacity.

SUMMARY OF THE INVENTION

It is an object of this invention to provide a process for producing a Nb₃Sn superconducting wire having a strong critical magnetic field and an improved critical current density in a strong magnetic field, which comprises adding titanium, zirconium and/or hafnium, i.e. elements of Group IV, to a copper matrix free from tin in a composite processing technique which greatly remedies the defects of the conventional composite processing technique.

In one aspect, the present invention provides a process for producing a Nb₃Sn superconducting wire, which comprises preparing a composite from a copper alloy matrix containing 0.1 to 5 atomic percent, preferably 0.2 to 3 atomic percent, especially preferably 0.5 to 2 atomic percent, in total of at least one element of Group IV of the periodic table selected from titanium, zirconium and hafnium, a tin core and niobium cores, processing the composite into a wire, tape or tube, and heat-treating the processed composite at a temperature of 400° to 900° C. to form a Nb₃Sn compound around the niobium cores.

In another aspect, the present invention provides a process for producing a Nb₃Sn superconducting wire, which comprises preparing a composite from a copper alloy matrix containing 0.1 to 5 atomic percent, preferably 0.2 to 3 atomic percent, especially preferably 0.5 to 2 atomic percent, in total of at least one element of Group IV of the periodic table selected from titanium, zirconium and hafnium, and niobium cores, thereafter processing the composite into a wire, tape or tube, coating the surface of the processed composite with tin by electroplating, etc., and heat-treating the coated composite at a temperature of 400° to 900° C. to form a Nb₃Sn compound around the niobium cores.

DETAILED DESCRIPTION OF THE INVENTION

Figure 1:
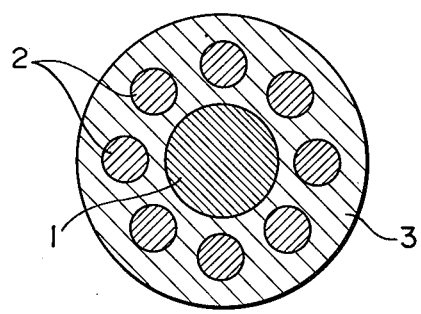
FIGS. 1 and 2 are cross-sectional views of composites used in the process of this invention.

According to the process of this invention, at least one of the aforesaid Group IV elements must be added to the copper matrix in a total amount of at least 0.1 atomic percent in order to obtain excellent superconducting characteristics and promote the formation of the Nb₃Sn compound. Moreover, the total amount of the Group IV elements should not exceed 5 atomic percent in order to maintain the good workability of the copper alloy matrix and to avoid inclusion of excessive amounts of such added elements in the Nb₃Sn compound layer.

Among the Group IV elements used in this invention, titanium and hafnium are preferred, and titanium is especially preferred.

The suitable amount of the tin in the composite or tin coated on it is 1 to 50% by volume based on the entire volume of the composite. If it is less than 1% by volume, the Nb₃Sn compound layer does not easily form. If, on the other hand, the amount of tin exceeds 50% by volume, compounds other than the Nb₃Sn are undesirably formed.

Tin may be coated on the surface of the composite by various methods such as electroplating, dipping or vacuum deposition. In the embodiment involving coating of the composite with tin, the coated composite may be preliminarily heat-treated at 100° to 400° C. before the heat-treatment for the formation of the Nb₃Sn compound in order to facilitate the diffusion of tin into the copper alloy matrix.

The tin material used in this invention is most preferably pure tin, but is not limited to it. For example, a tin-copper alloy containing up to 30 atomic percent of copper does not deteriorate the performance of the resulting superconducting wire.

In the heat-treatment of the composite to diffuse tin and niobium cores, temperatures in the range of 400° to 900° C. are desirable for the formation of the Nb₃Sn compound layer. At a temperature lower than 400° C., the rate of formation of the Nb₃Sn compound is very slow, and the superconducting properties of the final product are degraded. At a temperature higher than 900° C., the crystal grains of the resulting Nb₃Sn compound become extraordinarily coarse to degrade the superconducting properties of the final product.

Since the process of this invention uses a composite composed of a tin-free copper alloy matrix having good workability, and niobium cores having good workability and optionally a tin core having good workability, processing of the composite becomes very easy, and the composite can be processed into thin wires without the need for intermediate annealing. As a result, the cost of producing wires can be greatly curtailed. Titanium, zirconium or hafnium added to the copper alloy matrix promotes the formation of the Nb₃Sn compound. Moreover, as a result of a part of the added element dissolving in the Nb₃Sn compound, the critical magnetic field of the superconducting wire is increased and the critical current characteristics in a strong magnetic field of 15 tesla or more are markedly improved. In addition, in the diffusion step, a sufficient amount of tin can be supplied from the tin core in the composite or from the tin layer coated on the surface of the composite, a large amount of the Nb₃Sn compound can be formed. Hence, a wire having a large critical current capacity per unit cross-sectional area can be produced. The use of the resulting superconducting wire makes it possible to increase the performance of various machines and instruments utilizing superconductivity, and to make them small-sized, thus leading to a reduction in the cost of cooling. Furthermore, since the wire produced by this invention is an ultrafine multicore wire, stable superconductivity can be maintained against rapid variations in magnetic field, and this brings about the excellent advantage that the wire in accordance with this invention markedly increases the safety and reliability of machines and instruments used in a strong magnetic field.

EXAMPLE 1

A copper-1 atomic % titanium alloy, a copper-1 atomic % hafnium alloy, and a copper-1 atomic % zirconium alloy were each melted in a graphite crucible in a Tammann melting furnace. Each of the alloys was processed into a round rod having an outside diameter of 8 mm by swaging and machining. A tin rod, 2.5 mm in diameter, was inserted into the center of the round rod of the copper alloy, and furthermore, 8 niobium rods having a diameter of 1 mm were inserted around the tin rod to produce a composite having the cross-sectional structure shown in FIG. 1 in which the reference numeral 1 represents a tin core, 2, a niobium core, and 3, a Cu-Ti alloy matrix, a Cu-Hf alloy matrix or a Cu-Zr alloy matrix. The composite was processed into a wire having an outside diameter of 0.4 mm without intermediate annealing by working on a grooved roll and wire drawing. The resulting wire was sealed into a quartz tube under an argon atmosphere, and heat-treated at 725° C. for 50 hours.

The thicknesses of the Nb₃Sn compound layers in the resulting samples and the critical current values ($I_c$) and critical temperatures ($T_c$) of the samples are shown in Table 1.

It is seen that when titanium, hafnium or zirconium is added to the copper matrix, the critical current ($I_c$) of the resulting wire in a strong magnetic field of 15 tesla increases to 3 to 4 times that of a comparative sample containing no such Group IV element (Comparative Example 1 below), and that the critical temperature ($T_c$) of the wire is increased and the rate of forming the $Nb_3Sn$ compound is increased to about twice that in the comparative sample.

COMPARATIVE EXAMPLE 1

A superconducting wire was produced under the same conditions as in Example 1 except that a pure copper matrix was used instead of the copper alloy matrix. The processability and properties of the resulting wire are shown in Table 1.

EXAMPLE 2

Figure 2:
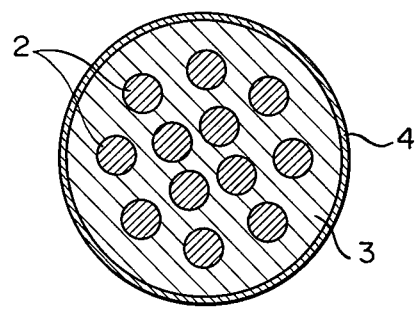

A copper-2 atomic % titanium alloy matrix, a copper-1 atomic % titanium alloy matrix, a copper-1 atomic % hafnium alloy matrix, or a copper-1 atomic % zirconium alloy matrix produced by melting in the same way as in Example 1 was processed into a round rod having an outside diameter of 8 mm. Twelve niobium rods, 1.0 mm in outside diameter, were inserted into the round rod to make a composite. The composite was processed into a wire having an outside diameter of 0.35 mm by working on a grooved roll and wire drawing. A layer of tin having a thickness of about 17 μm was coated by electroplating on the periphery of the composite wire as shown in FIG. 2, sealed up in a quartz tube under an argon atmosphere and heat-treated at 725° C. for 50 hours. In FIG. 2, the reference numeral 2 represents a niobium core, 3, a Cu-Ti, Cu-Hf or Cu-Zr alloy matrix, and 4, a tin plated layer.

COMPARATIVE EXAMPLE 3

Reproduction of U.S. Ser. No. 302,956:

A copper-7 atomic % tin alloy was melted in a Tammann furnace, and processed into a round rod having an outside diameter of 8 mm by swaging and machining. Then, eight holes 1.1 mm in diameter were bored in the rod, and eight rods, 1 mm in diameter, of a niobium-1 atomic % titanium were inserted into the holes to produce a composite having a cross-sectional structure similar to that shown in FIG. 1 except that there was no tin core 1 at the center. The composite was processed into a wire having an outside diameter of 0.4 mm by working on a grooved roll and wire drawing. Eleven intermediate annealing operations were required during the processing of the composite because the copper-tin alloy has inferior workability to pure copper or a copper-1 atomic % (titanium, zirconium or hafnium) alloy. These intermediate annealing operations were performed each at 600° C. for 1 hour. The processed composite was heat-treated at 725° C. for 50 hours. The properties of the resulting wire are shown in Table 1.

COMPARATIVE EXAMPLE 4

Reproduction of U.S. Ser. No. 402,581:

A superconducting wire was produced under the same conditions as in Comparative Example 3 except that a copper-7 atomic % tin-1 atomic % titanium alloy was used instead of the copper-7 atomic % tin alloy, and a pure niobium core was used instead of the niobium-1 atomic % titanium alloy core. The processability and properties of the resulting wire are shown in Table 1.

| Run | | Composite Matrix | Core (1) | Core (2) | Coating | Processability (number of intermediate annealings required) | Thickness of the $Nb_3Sn$ layer (μm) | Superconducting properties $I_c$ at 15T (A) | $T_c$ (K) |
|---|---|---|---|---|---|---|---|---|---|
| Example 1 | (a) | Cu-1 at % Ti | Sn | Nb | — | 0 | 16 | 40 | 18.1 |
| | (b) | Cu-1 at % Hf | Sn | Nb | — | 0 | 17 | 35 | 18.1 |
| | (c) | Cu-1 at % Zr | Sn | Nb | — | 0 | 13 | 30 | 17.8 |
| Comparative Example 1 | | Cu | Sn | Nb | — | 0 | 8 | 10 | 17.4 |
| Example 2 | (a) | Cu-2 at % Ti | — | Nb | Sn | 0 | 19 | 51 | 18.0 |
| | (b) | Cu-1 at % Ti | — | Nb | Sn | 0 | 18 | 46 | 18.1 |
| | (c) | Cu-1 at % Hf | — | Nb | Sn | 0 | 19 | 42 | 18.1 |
| | (d) | Cu-1 at % Zr | — | Nb | Sn | 0 | 15 | 40 | 17.9 |
| Comparative Example 2 | | Cu | — | Nb | Sn | 0 | 8 | 12 | 17.4 |
| Comparative Example 3 | | Cu-7 at % Sn | — | Nb-1 at % Ti | — | 11 | 10 | 10 | 17.6 |
| Comparative Example 4 | | Cu-7 at % Sn-1 at % Ti | — | Nb | — | 13 | 14 | 18 | 17.2 |

The properties of the resulting samples were measured, and the results are shown in Table 1.

The effect obtained was the same as that obtained in Example 1. The addition of the Group IV elements markedly increased the critical current ($I_c$) of the wire in a strong magnetic field and its critical current density per unit cross-sectional area of the wire.

COMPARATIVE EXAMPLE 2

A superconducting wire was produced under the same conditions as in Example 2 except that a pure copper matrix was used instead of the copper alloy matrix. The processability and properties of the resulting wire are shown in Table 1.

What is claimed is:

1. A process for producing a $Nb_3Sn$ superconducting wire, which comprises preparing a composite from a tin material, a niobium material and a matrix of copper alloy material which is tin-free containing 0.1 to 5 atomic percent in total of at least one element of Group IV of the periodic table selected from the group consisting of titanium, zirconium, and hafnium; processing the composite into a wire, tape or tube; and heat-treating the processed composite at a temperature of 400° to 900° C. to form a $Nb_3Sn$ compound.

2. The process of claim 1 wherein the total amount of the Group IV element is 0.2 to 3 atomic percent.

3. The process of claim 1 wherein the copper alloy material contains 0.1 to 5 atomic percent of titanium.

4. The process of claim 1 wherein the copper alloy material contains 0.1 to 5 atomic percent of hafnium.

5. A process for producing a Nb$_3$Sn superconducting wire, which comprises preparing a composite from a niobium material and a matrix of copper alloy material which is tin-free containing 0.1 to 5 atomic percent in total of at least one element of Group IV of the periodic table selected from the group consisting of titanium, zirconium and hafnium; processing the composite into a wire, tape or tube; coating the surface of the processed composite with tin, and thereafter heat-treating the coated composite at a temperature of 400° to 900° C. to form a Nb$_3$Sn compound.

6. The process of claim 5 wherein the total amount of the Group IV element is 0.2 to 3 atomic percent.

7. The process of claim 5 wherein the copper alloy material contains 0.1 to 5 atomic percent of titanium.

8. The process of claim 5 wherein the copper alloy material contains 0.1 to 5 atomic percent of hafnium.

* * * * *